United States Patent
Cho et al.

(10) Patent No.: US 7,941,714 B2
(45) Date of Patent: May 10, 2011

(54) PARALLEL BIT TEST APPARATUS AND PARALLEL BIT TEST METHOD CAPABLE OF REDUCING TEST TIME

(75) Inventors: Yong-hwan Cho, Cheonan-si (KR);
Kwun-soo Cheon, Suwon-si (KR);
Hyun-soon Jang, Seoul (KR);
Seung-whan Seo, Cheonan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 548 days.

(21) Appl. No.: 12/003,900

(22) Filed: Jan. 3, 2008

(65) Prior Publication Data
US 2008/0168316 A1 Jul. 10, 2008

(30) Foreign Application Priority Data
Jan. 9, 2007 (KR) .................. 10-2007-0002651

(51) Int. Cl.
*G11C 29/00* (2006.01)
*G11C 7/00* (2006.01)
(52) U.S. Cl. ...................................... 714/719; 365/201
(58) Field of Classification Search .............. 714/718, 714/719; 365/200, 201
See application file for complete search history.

(56) References Cited

U.S. PATENT DOCUMENTS

| | | | |
|---|---|---|---|
| 5,471,480 A * | 11/1995 | You | 714/719 |
| 6,263,141 B1 | 7/2001 | Smith | |
| 6,788,596 B2 * | 9/2004 | Kim et al. | 365/200 |
| 6,845,478 B2 * | 1/2005 | Luong | 714/738 |
| 7,036,058 B1 | 4/2006 | Miyachi et al. | |
| 7,546,506 B2 * | 6/2009 | Sonoda et al. | 714/738 |
| 2003/0043664 A1 * | 3/2003 | Haraguchi et al. | 365/201 |
| 2007/0011518 A1 * | 1/2007 | Ung et al. | 714/724 |

FOREIGN PATENT DOCUMENTS

| | | |
|---|---|---|
| KR | 93-22382 | 11/1993 |
| KR | 10-2001-0049778 A | 6/2001 |
| KR | 10-2002-0002943 A | 1/2002 |

(Continued)

OTHER PUBLICATIONS

Zorian, Y.; , "Multi-chip module technology," Neural Networks, 1995. Proceedings., IEEE International Conference on , vol. 1, No., pp. 152-157 vol. 1, Nov./Dec. 1995 doi: 10.1109/ICNN.1995. 488084.*

(Continued)

*Primary Examiner* — Cynthia Britt
(74) *Attorney, Agent, or Firm* — Lee & Morse, P.C.

(57) ABSTRACT

A parallel bit test (PBT) apparatus, included in memory chips that are stacked in a multi-chip package (MCP) and that share a set of data signal lines, may include: a comparing unit to output a data signal representative of a comparison between test data signals provided to a given one of the memory chips and corresponding data signals output therefrom, respectively; and a coding unit to output the representative data signal using a first subset of the shared set of data signal lines, the first subset not overlapping other subsets used by coding units corresponding to the other ones of the memory chips, respectively, the coding unit selecting one or more of the data signal lines amongst the shared set of data signal lines for inclusion in the first subset according to a first test mode register set (MRS) signal.

20 Claims, 6 Drawing Sheets

FOREIGN PATENT DOCUMENTS

| KR | 10-2004-0070924 A | 8/2004 |
| --- | --- | --- |
| KR | 10-2004-0080552 A | 9/2004 |

OTHER PUBLICATIONS

Lin, T.-T.Y.; Comito, J.; Kaseff, C.; , "Evaluation of test strategies for multichip modules," ASIC Conference and Exhibit, 1992., Proceedings of Fifth Annual IEEE International , vol., No., pp. 234-237, Sep. 21-25, 1992 doi: 10.1109/ASIC.1992.270269.*

Round, B.J.; , "Manufacturing defects testing of a multi-chip-module using IEEE 1149.1 boundary scan test and embedded built-in test software," Autotestcon '93. IEEE Systems Readiness Technology Conference. Proceedings , vol., No., pp. 151-156, Sep. 20-23, 1993 doi: 10.1109/AUTEST.1993.396355.*

\* cited by examiner

PARALLEL BIT TEST APPARATUS AND PARALLEL BIT TEST METHOD CAPABLE OF REDUCING TEST TIME

BACKGROUND OF THE INVENTION

1. Field of the Invention

The present invention relates to a parallel bit test (PBT) apparatus and PBT method and, more particularly, to a PBT apparatus and PBT method capable of reducing test time.

2. Description of the Related Art

In a semiconductor memory chip, a transmission error may occur while a data bit is transmitted after being encoded or while the data bit is outputted after being decoded. Alternatively, recorded data may be read wrongly due to a memory chip operation failure. Various test modes exist for checking a defective memory chip. A PBT apparatus and/or a PBT method uses one of various test modes.

A PBT mode is a test mode which can be used to test bit lines of a semiconductor memory chip, such as a dynamic random access memory (DRAM) chip, or the like. During a PBT, a write operation is performed on a DRAM chip in order to store data in each cell. Then, the stored data is read and tested by merging data loaded on data lines.

It is expensive and time consuming to test each cell or each bit line in order to check whether the data loaded on the bit lines is normal. Accordingly, the related art PBT apparatus uses a comparator formed of logic operation devices, such as an exclusive OR (XOR) gate, etc. Using the comparator, in effect, performs a data merge method which compresses the data loaded on data line. As described above, the PBT apparatus and/or PBT method is used to merge and parallel test the input data.

A related art multi-chip package (MCP) can have a structure in which a plurality of, e.g., four, identical memory chips are stacked. Each of the memory chips includes the same PBT apparatus therein. While performing a PBT, the four memory chips are sequentially tested one by one. That is, the four memory chips receive an input data signal via the same input line, and output an output data signal (or a representative data signal) via the same output line.

Since the four memory chips cannot simultaneously use the same output line, the four memory chips are sequentially parallel bit tested one by one. It takes a given amount of time t1 for testing one memory chip. Accordingly, when testing a MCP stacked with n memory chips, it takes a total amount of time t1×n.

In the four-chip example, when the memory chips receive 32 data signals DQ0 through DQ31 and output a representative data signal by comparing and determining whether the data signals DQ0 through DQ31 are the same, an output line of the representative data signal is DQ4. Here, a conventional PBT will receive n pieces of input data and will test the input data by merging them. Accordingly, less than n pieces of output data are outputted. A signal line can transmit one signal at a time due to bus accessibility. When a first one of the memory chips outputs the representative data signal DQ4 by performing a PBT for the given time t1 and the remaining three memory chips repeat the same PBT, it takes an amount of time t1×4 to test the four-chip MCP (again, an MCP stacked with four memory chips).

As described above, test time increases proportionally to the number of memory chips stacked in a MCP. That is, temporal efficiency decreases. Also, when test time increases, test cost also increases.

SUMMARY OF THE INVENTION

Embodiments of the present invention are therefore directed to a PBT apparatus, a MCP including or associated with such a PBT apparatus, and a corresponding PBT method, which substantially overcome one or more problems due to limitations and disadvantages of the related art.

It is therefore a feature of an embodiment of the present invention to provide a PBT apparatus which can, e.g., reduce test time, and thus can reduce test cost.

It is therefore another feature of an embodiment of the present invention to provide a MCP, including or associated with such a PBT apparatus, which needs, e.g., a reduced amount of test time, and thus is less costly to test.

It is therefore another feature of an embodiment of the present invention to provide a PBT method which can, e.g., reduce test time, and thus can reduce test cost.

At least one of the above and other features and advantages of the present invention may be realized by providing a PBT apparatus, included in memory chips that are stacked in a MCP and that share a set of data signal lines. Such a PBT apparatus may include: a comparing unit to output a representative data signal that is representative of a comparison between test data signals provided to a given one of the memory chips and corresponding data signals output therefrom, respectively; and a coding unit to output the representative data signal using a first subset of the shared data signal line set, the first subset not overlapping other subsets used by coding units corresponding to the other ones of the memory chips, respectively, the coding unit selecting one or more of the data signal lines amongst the shared data signal line set for inclusion in the first subset according to a first test mode register set (MRS) signal.

At least one of the above and other features and advantages of the present invention may be realized by providing a MCP, comprising: memory chips that share a plurality of data signal lines; and a plurality of PBT apparatus at least associated with the memory chips, respectively, e.g., in a 1:1 ratio. Each PBT apparatus may include at least the following: a comparing unit to output a data signal representative of a comparison between test data signals provided to an associated one of the memory chips and corresponding data signals output therefrom, respectively; and a coding unit to output the representative data signal using a first subset of the shared data signal line set, the first subset not overlapping other subsets used by coding units corresponding to the other ones of the memory chips, respectively, the coding unit selecting one or more of the data signal lines amongst the shared data signal line set for inclusion in the first subset according to a first test mode register set (MRS) signal.

At least one of the above and other features and advantages of the present invention may be realized by providing a PBT method which simultaneously tests memory chips stacked in a MCP, the memory chips sharing a set of data signal lines. Such a PBT method may include: receiving a command to perform a PBT on the memory chips; outputting representative signals that represent comparisons between groups of test data signals provided to the memory chips and corresponding groups of data signals output therefrom, respectively; selecting non-overlapping subsets of the one or more of the data signal lines amongst the shared set of data signal lines, the non-overlapping subsets corresponding to the memory chips, respectively; and outputting the representative signals via the non-overlapping subsets of data signal lines, respectively.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 10-2007-0002651, filed on Jan. 9, 2007, in the Korean Intellectual Property Office, and entitled: "Parallel Bit Test Apparatus and Parallel Bit Test Method Capable of Reducing Test Time," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
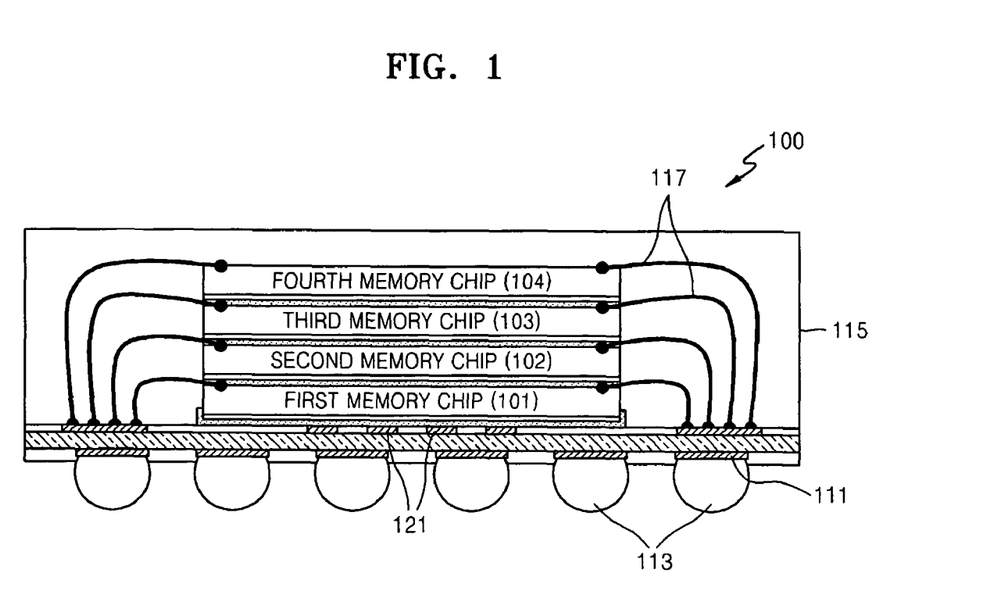
FIG. 1 is a diagram (according to an exemplary embodiment of the present invention) illustrating a structure of a MCP.

FIG. 1 is a diagram illustrating (according to an exemplary embodiment of the present invention) a structure of a MCP 100. Variations of the MCP 100 can be adapted to different applications, respectively.

Referring to FIG. 1, the MCP 100 may have a structure in which a plurality of memory chips, e.g., four (namely, 101, 102, 103, and 104), may be stacked. Alternatively, other quantities of memory chips may be stacked in the MCP 100. Each of the memory chips 101~104 may integrally include (or have associated therewith discretely, e.g., according to a 1:1 ratio) a PBT apparatus (to be discussed in more detail below). The memory chips 101~104 may be, e.g., dynamic random access memory (DRAM) chips, or the like. The memory chips 101~104 may have, e.g., identical input/output-signal electrode architectures, and hence the corresponding PBT apparatus may have, e.g., identical input/output-signal electrode architectures. As such, the memory chips 101, 102, 103, and 104 may receive an input data signal via, e.g., the same input line, and output an output data signal (or a representative data signal) via, e.g., the same output line. In other words, an effect (among others) of the identical input/output-signal electrode architectures is that of providing a shared set of data signal line set.

The stacked memory chips 101, 102, 103, and 104 may be, e.g., disposed inside a mold 115, and may be electrically connected to a control apparatus (not shown), such as a central processing unit (CPU) by, e.g., solder balls 113. Also, the solder balls 113 and each of the memory chips 101, 102, 103, and 104 may be connected via electric wires 117. Here, the illustrated structure is one example from among various possible structures of a MCP. Accordingly, it should be understood that the structure of the MCP 100 may vary.

A clock signal CLK and/or various commands CMD generated from an external control apparatus may be transmitted to the solder balls 113. The clock signal CLK and/or various commands CMD transmitted to the solder balls 113 may be transmitted to each of the memory chips 101, 102, 103, and 104 via the electric wires 117.

Some, but not necessarily all, signals received by the MCP 100 may be applied to all of the chips 101, 102, 103, and 104 therein via the electric wires 117. Some received signals may be separated before being applied, based on the particular variation of the MCP 100. For example, each of the memory chips 101, 102, 103, and 104 may receive, e.g., a clock enable (CKE) signal and a chip selection bar (CSB) signal in order to be individually operated. Also, remaining signals including, e.g., a data signal line (which transmits a data output signal) may be commonly transmitted to the memory chips 101, 102, 103, and 104. Also, when signals (e.g., except the CKE signal and the CSB signal) are outputted, it may be preferable, e.g., to avoid simultaneously outputting the same signal from at least two of the memory chips 101, 102, 103, and 104. For example, when the memory chip 101 is transmitting a signal via a fourth data signal line DQ4, the remaining memory chips 102, 103, and 104 should not transmit a signal via the fourth data signal line DQ4.

Figure 2A:
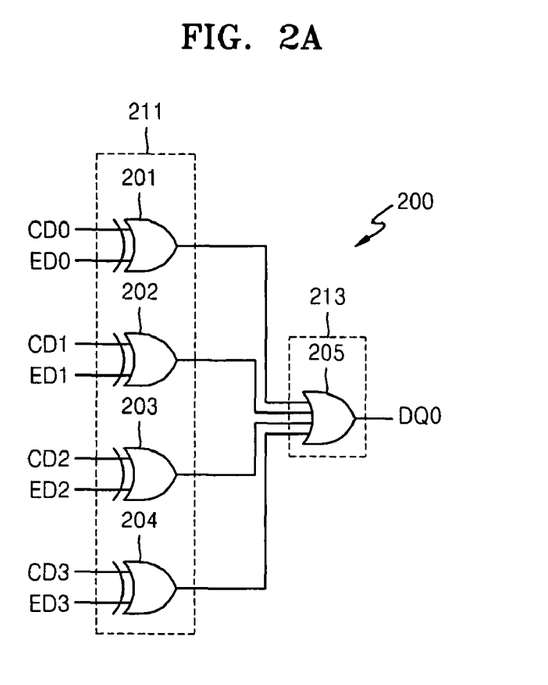
FIG. 2A is a diagram (according to an exemplary embodiment of the present invention) illustrating a pre comparator that may be disposed prior to (or in front of, or precede) a PBT apparatus in order to generate an input data signal.

FIG. 2A is a diagram (according to an exemplary embodiment of the present invention) illustrating a pre comparator 200 that may be disposed in front of a PBT apparatus in order to generate an input data signal. The pre comparator 200 includes a plurality of comparators 211 and 213.

A first comparator 211 includes a plurality of XOR gates 201, 202, 203, and 204. A second comparator 213 includes an OR gate 205. In the context of the example which FIG. 2A represents, the input data signal is a 4 bit signal. Accordingly, as the number of bits of the input data signal increases, the numbers of XOR gates and comparators may increase. As an alternative to being external to and preceding a given PBT apparatus, the pre comparator 200 may be incorporated into, e.g., an otherwise conventional PBT apparatus.

An XOR gate may detect a fail bit by comparing an expected data signal EDi and a data signal CDi. The expected data signal EDi may represent the signal originally provided to the device that is the subject of the test. The data signal CDi may represent a version of the expected data signal EDi after the same has been provided to the subject device and then outputted from the subject device to the XOR gate. That is, the data signal CDi and the expected data signal EDi are compared to check whether they are equal, in order to determine whether an error has occurred.

For example, in the context of the example which FIG. 2A represents, when transmitted data is 1101 and original data before the transmission is 1100, CDi=1 1 0 1 and EDi=1 1 0 0. When the data signal CDi and the expected data signal EDi are the same, the XOR gate outputs 0, and when they are different, the XOR gate outputs 1. Accordingly in the current example, the XOR gate 201 handles bit zero (0), i=0, accordingly receives CD0=1 and ED1=0, and hence outputs 1 since the data signal CDi and the expected data signal EDi are not the same. Also, the remaining XOR gates 202, 203, and 204 respectively output 0 since the data signals CDi and the expected data signals EDi are same. The OR gate 205 receives an input signal of 1, 0, 0, 0 and outputs 1 by OR operating the input signal. That is, when an output signal DQ0 of the OR gate 205 is 1, an error has occurred, and when the output signal DQ0 is 0, an error has not occurred.

Here, the output signal DQ0 is shown on an output terminal of the OR gate 205. This means that a signal outputted from the comparator 213 disposed at the end is used as a data signal DQ inputted to the PBT apparatus.

Figure 2B:
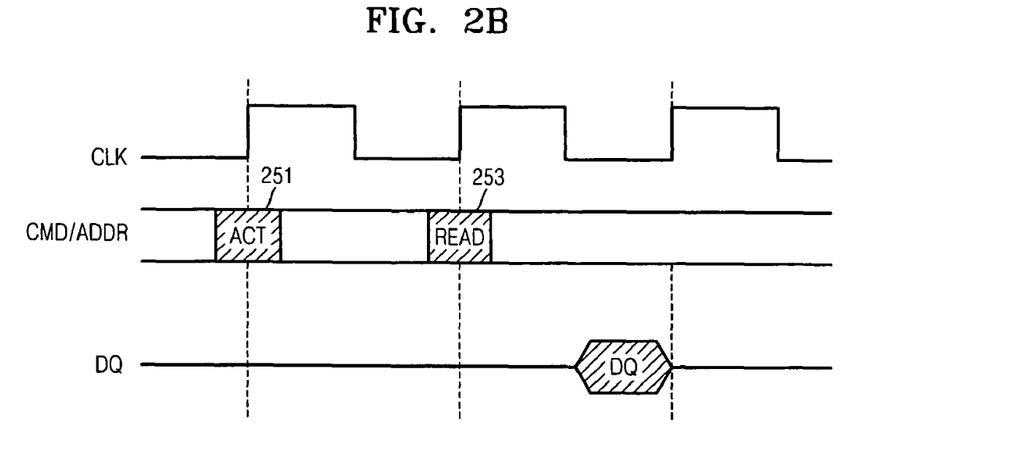
FIG. 2B is a diagram (according to an exemplary embodiment of the present invention) illustrating signals inputted to the comparator illustrated in FIG. 2A.

FIG. 2B is a diagram (according to an exemplary embodiment of the present invention) illustrating signals inputted to the comparators 211 and 213 illustrated in FIG. 2A. In FIG. 2B, in order to read the data signal CDi, which is pre-transmitted and stored, an activation signal ACT 251, which activates a bit line, is inputted at a rising edge of a clock signal CLK. Then, a read signal READ 253 is inputted at a next rising edge of the clock signal CLK. The expected data signal EDi is read due to the read signal READ 253.

Figure 3:
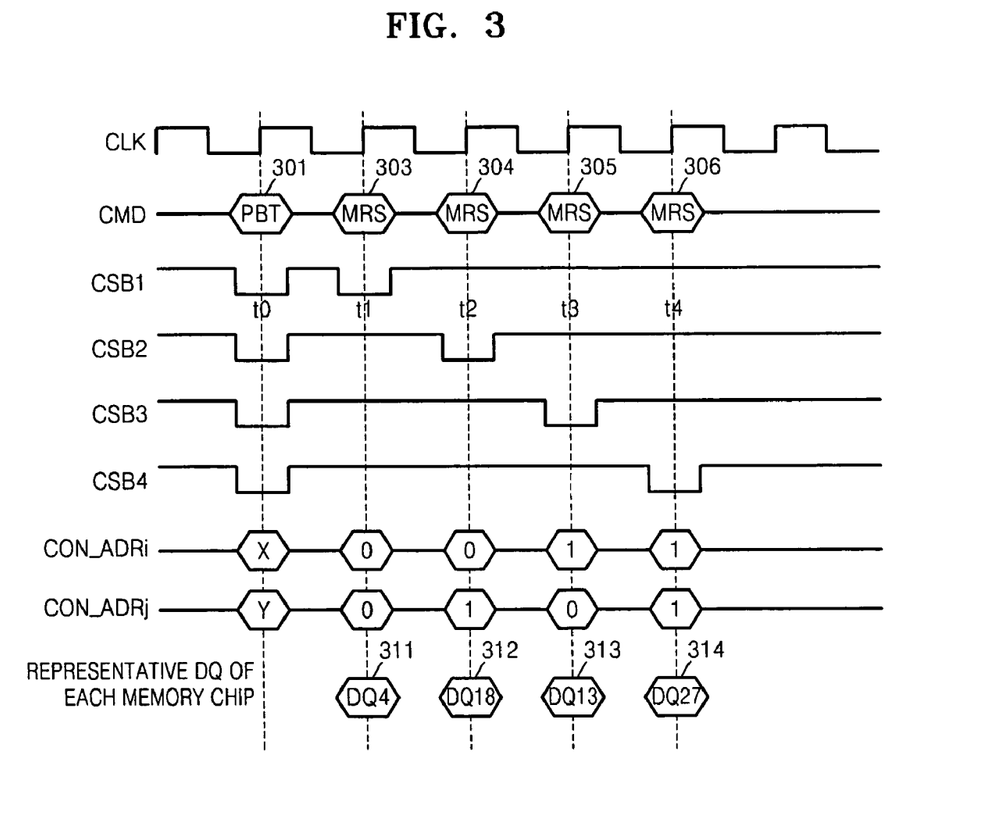
FIG. 3 is a diagram (according to an exemplary embodiment of the present invention) illustrating signals and commands inputted to a PBT apparatus.

FIG. 3 is a diagram illustrating signals and commands inputted to a PBT apparatus according to an exemplary embodiment of the present invention. In FIG. 3, CLK, CMD, and CSB respectively denote a clock signal, a command signal, and a memory chip selection signal activated in a logic low state. Also, FIG. 3 builds upon the example of FIG. 2A, hence FIG. 3 depicts a circumstance in which four identical memory chips may be stacked in a MCP.

First, the clock signal CLK may be continuously generated at a uniform frequency. Also, the command signal CMD may be applied at a rising edge of the clock signal CLK. The memory chip selection signals CSB1, CSB2, CSB3, and CSB4 may be respectively applied to each memory chip in the MCP. The chip selection signal CSB1 may be applied to a first memory chip which is the lowest of the stack, the chip selection signal CSB2 may be applied to a second memory chip which is second lowest of the stack, the chip selection signal CSB3 may be applied to a third memory chip which is third lowest of the stack, and the chip selection signal CSB4 may be applied to a fourth memory chip which is on top of the stack.

Here, a PBT signal 301 may represent a command to perform a PBT. Also, mode register set (MRS) signals 303, 304, 305, 306, CON_ADRi, and CON_ADRj may be set and inputted by a user. The MRS signals 303, 304, 305, 306, CON_ADRi, and CON_ADRj, may be test MRS signals TMRS. The MRS signals CON_ADRi, and CON_ADRj may be classified as a first type of test MRS signals TMRS_1, respectively. The MRS signals 303, 304, 305, and 306 may be classified as a second type of test MRS signals TMRS_2, respectively.

First, when the PBT signal 301 is applied at a time t0, a PBT mode begins. Operations of a memory chip may be classified into a normal mode in which a read or write operation is performed and a PBT mode in which PBT is performed. When the PBT signal 301 is applied, the memory chip operates in the PBT mode.

Then, the second test MRS signals TMRS_2, namely MRS signals 303, 304, 305, and 306 (for sequentially selecting the first through fourth memory chips, respectively) may be applied. The second test MRS signal 303 may be applied at a time t1 and may be a signal set by a user to select the first memory chip. The second test MRS signal 304 may be applied at a time t2 and may be a signal set by a user to select the second memory chip. The second test MRS signal 305 may be applied at a time t3 and may be a signal set by a user to select the third memory chip. Lastly, the second test MRS signal 306 may be applied at a time t4 and may be a signal set by a user to select the fourth memory chip.

The first test MRS signals TMRS_1, namely CON_ADRi and CON_ADRj, may be inputted to independently classify and select data signal lines DQ respectively connected to the first through fourth memory chips. The first test MRS signal CON_ADRi may be expressed as X and the first test MRS signal CON_ADRj may be expressed as Y. When XY is 00, the data signal line DQ connected to the first memory chip may be selected to be DQ4 311, when XY is 01, the data signal line DQ connected to the second memory chip may be selected to be DQ18 312, when XY is 10, the data signal line DQ connected to the third memory chip may be selected to be DQ13 313, and when XY is 11, the data signal line DQ connected to the fourth memory chip may be selected to be DQ27 314.

In other words, when the second test MRS signal 303 is applied at the time t1, the first memory chip is selected, and when XY, which are first test MRS signals CON_ADRi and CON_ADRj, is inputted as 00, a signal outputted from the first memory chip is outputted through the data signal line DQ4 311. Here, XY may be changed based on the user in order to activate different data signal lines DQ. For example, 00 may be set to connect DQ7 and the first memory chip.

A representative data signal for each memory chip may be provided on a data signal line DQn. For a given memory chip, such a data signal may be the result of the PBT performed therein and so may be representative of an error state (or lack thereof) in the contents of the respective memory chip.

An instance of a PBT apparatus that incorporates the current embodiment may set the data signal line DQn (in which the representative data signal is transmitted) to be different for each memory chip, respectively. For example as illustrated in FIG. 3, the representative data signal of the first memory chip may be transmitted to DQ4 311, the representative data signal of the second memory chip may be transmitted to DQ18 312, the representative data signal of the third memory chip may be transmitted to DQ13 313, and the representative data signal of the fourth memory chip may be transmitted to DQ27 314. By setting the representative data signals of each memory chip to be transmitted to different data signal lines DQn using the first test MRS signals TMRS_1 (namely, again, CON_ADRi and CON_ADRj), the memory chips stacked in the MCP can be simultaneously tested. Hereinafter, this will be described in detail with reference to FIGS. 4 and 5.

Figure 4:
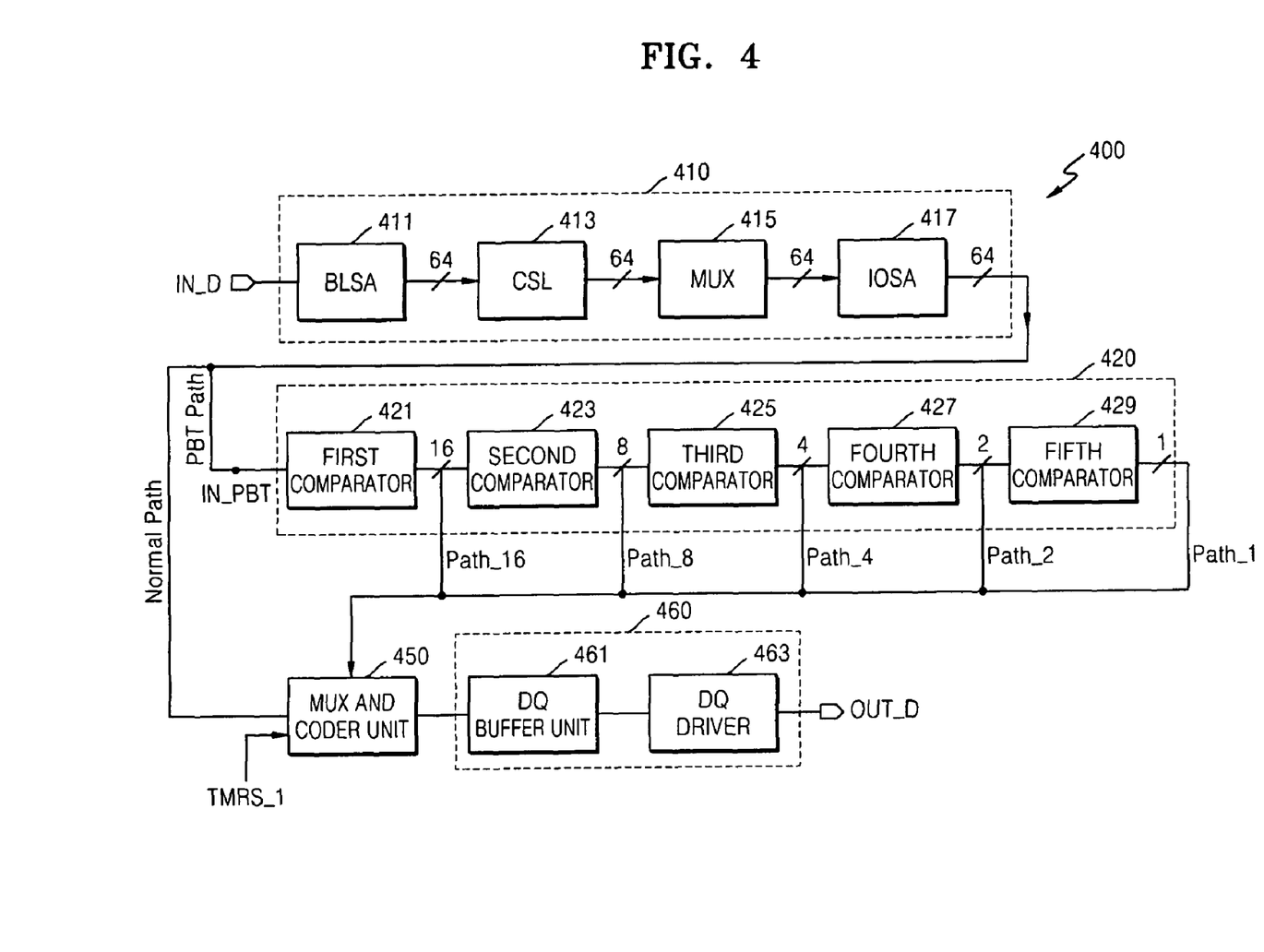
FIG. 4 is a block diagram (according to an exemplary embodiment of the present invention) illustrating a PBT apparatus.

FIG. 4 is a block diagram illustrating a PBT apparatus 400 according to an exemplary embodiment of the present invention. In FIG. 4, the PBT apparatus 400 may include a comparing unit 420, a MUX and coder unit 450, and an output unit 460 that itself may include a DQ buffer unit 461, and a DQ driver 463.

A memory chip to be tested (not depicted in FIG. 4) may provide a test signal. An input signal processor 410 may receive the test signal from the memory chip, and senses and then outputs the received signal. The signal outputted from the input signal processor 410 may be operated upon by the PBT. Accordingly, FIG. 4 depicts the PBT apparatus 400 as including the input signal processor 410.

The input signal processor 410 may include a bit line sense amplifier (BLSA) 411, a column selection signal unit (CSL) 413, a MUX 415, and an input/output signal sense amplifier (IOSA) 417. The BLSA 411 may sense and may output a signal IN_D received via a bit line BL and a complementary bit line /BL. Accordingly, when the BLSA 411 receives, e.g., 32 (bits) signals, then 32 signals are outputted to the bit line BL and 32 signals are outputted to the complementary bit line /BL, and thus total 64 signals are outputted.

The CSL 413 may output the output signal of the BLSA 411 to the MUX 415 in response to a column selection signal. There may be different types of input/output (IO) to which of the MUX 415 is adapted. For example, the MUX 415 may be a local input/output (LIO) MUX or a global IO (GIO) MUX. The input signal processor 410 may be employed by all memory chips, and structure and operations of the input signal processor 410 are readily understood by one of ordinary skill in the art.

The MUX 415 may output a global 10 (again, GIO) signal and a complementary GIO (/GIO) signal. The IOSA 417 may receive the GIO signal and the /GIO signal outputted from the MUX 415 and may output a data signal by sensing the GIO signal and the /GIO signal. The data signal outputted from the IOSA 417 is illustrated as, e.g., 64 bits because (in the context of the example which FIG. 4 represents) the data signal includes 32 data signals (IO) and 32 complementary data signals (/IO).

The comparing unit 420 may include a plurality of comparators 421, 423, 425, 427, and 429. The comparing unit 420 may output a representative data signal, which may include information about whether an error has occurred, by determining whether input data signals IN_PBT are the same. Such a representative data signal can be described as representing the results of a comparison between test data signals provided to a given memory chip and corresponding data signals output therefrom, respectively.

The detailed structure of the comparing unit 420 will be described below with reference to FIG. 6. Here, the input data signals IN_PBT may be signals outputted from the IOSA 417, e.g., excluding the complementary signals. Accordingly, when the IOSA 417 outputs 64 (bits) signals, the comparing unit 420 may receive 32 (bits) input data signals IN_PBT. The input data signals IN_PBT may be received through n data signal lines DQi.

Figure 6:
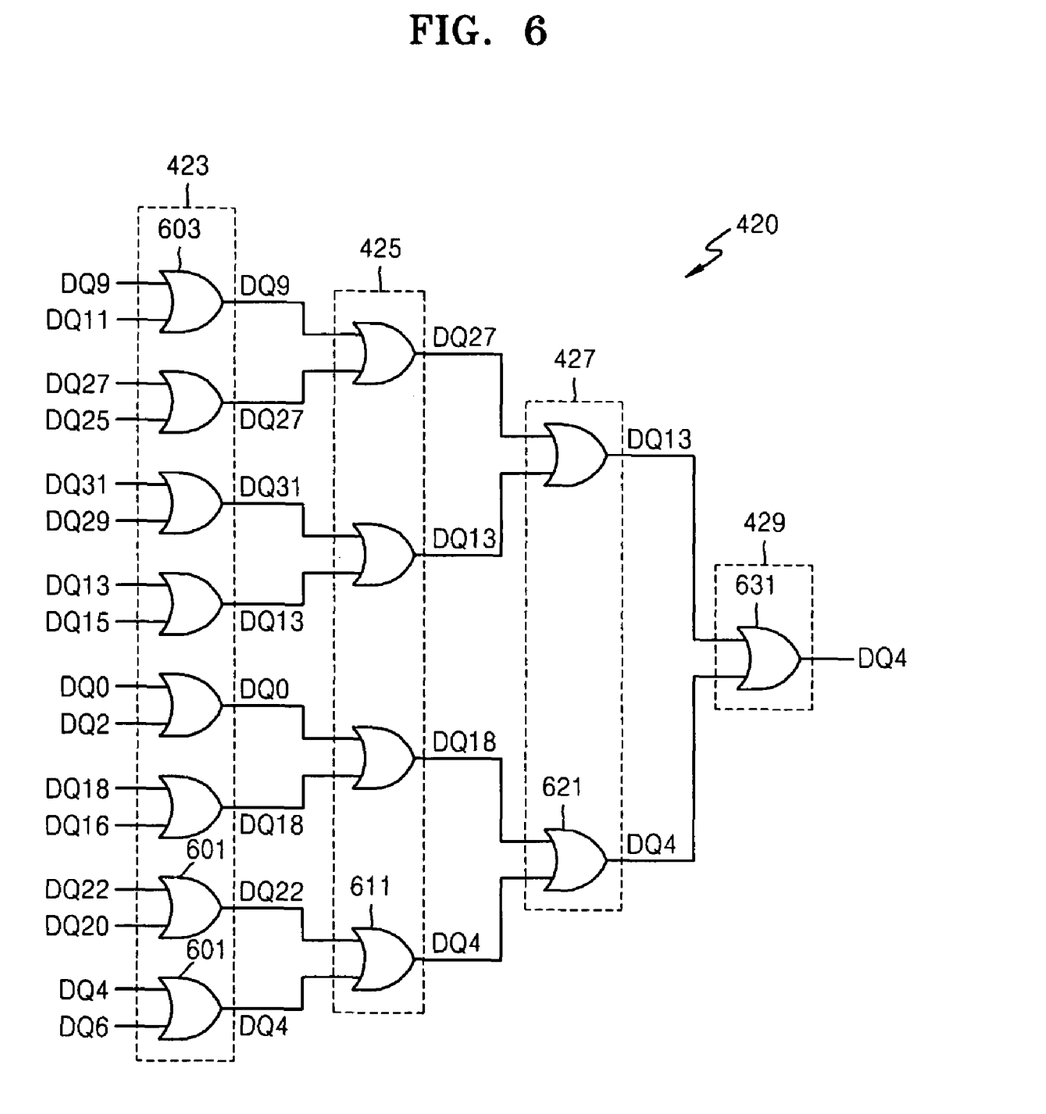
FIG. 6 is a diagram (according to an exemplary embodiment of the present invention) illustrating a detailed structure of a comparator illustrated in FIG. 4.

FIG. 6 is a diagram (according to an exemplary embodiment of the present invention) illustrating a detailed structure of the comparing unit 420 illustrated in FIG. 4.

Referring to FIG. 6, the comparing unit 420 may include a plurality of comparators 421, 423, 425, 427, and 429 formed of, e.g., OR gates. In FIG. 6, the first comparator 421 is not shown (for simplicity of depiction). The second comparator 423 may include, e.g., 8 OR gates, wherein each OR gate may receive, e.g., two data signals DQ. The two data signals DQ may be OR operated (combined via a logical OR operation) in order to output, e.g., one signal to the third comparator 423 connected to the next terminal. Here, the number of comparators included in the comparing unit 420 may vary. For example, the comparing unit 420 may include, e.g., only the first, second, and third comparators 421, 423, and 425 in order to output, e.g., four data signals DQ to four data signal lines DQ27, DQ13, DQ18, and DQ4.

A representative data line of an outputted data signal can be set, e.g., according to a user's preference, e.g., while manufacturing a memory chip. For example, in the case of an OR gate 603, input data signals may be OR operated via data signal lines, e.g., DQ9 and DQ11, and the OR operated signal may be transmitted through the data signal line, e.g., DQ9.

Alternatively, e.g., the user can configure the comparing unit 420 so as to transmit the OR operated signal through the data signal line DQ11. The skilled artisan would understand that a comparator may be formed of various logic gates, e.g., such as an OR gate, and/or an AND gate, etc.

As noted, memory chips each may include the same PBT apparatus (comparator and coder). Accordingly, for example, the comparators illustrated in FIG. 6 may be included in each memory chip.

The MUX and coder 450 of FIG. 4 may output a representative data signal to a data signal line DQ selected by the user, in response to a first test MRS signal TMRS_1. Here, the first test MRS signal TMRS_1 may regulate representative data signals, respectively outputted from each coder included in the chips stacked in a MCP, to be outputted using different data signal lines DQ. The representative data signals inputted to the coder may be changed to another representative data signal selected by the user in order to output the changed representative data signal using a corresponding data signal line DQ. The first test MRS signal TMRS_1 may be a signal set and may be inputted by the user.

In other words, the MUX and coder 450 of FIG. 4 may output the representative data signal using a first subset of the shared data signal line set. The first subset may be configured so as to not overlap other subsets used by instances of the MUX and coder 450 corresponding to the other ones of the memory chips, respectively. The MUX and coder 450 may be operable to select one or more of the data signal lines amongst the shared set for inclusion in the first subset according to the first test MRS signal TMRS_1.

As illustrated in FIG. 6, when the comparing unit 420 includes, e.g., first through fifth comparators (five comparators) (in FIG. 6, again, the first comparator is not shown), the representative data signal outputted may take the form of one (1 bit), and may be outputted through the data signal line DQ4. For example, where the same chips are stacked in the MCP, the representative data signal may be outputted from the fifth comparator 429 using, e.g., the data signal line DQ4.

The PBT apparatus 400 respectively may connect the representative data signals outputted from the stacked chips to different data signal lines in the MUX and coder 450 of FIG. 4. Thus, the representative data signals may be simultaneously outputted from each chip.

Operations and structures of the MUX and coder 450 will be described in detail with reference to FIG. 5.

Returning to FIG. 5, the DQ buffer 461 may buffer and output a signal received from the MUX and coder unit 450. Also, the DQ driver 463 may drive and output an output of the DQ buffer unit 461.

Figure 5:
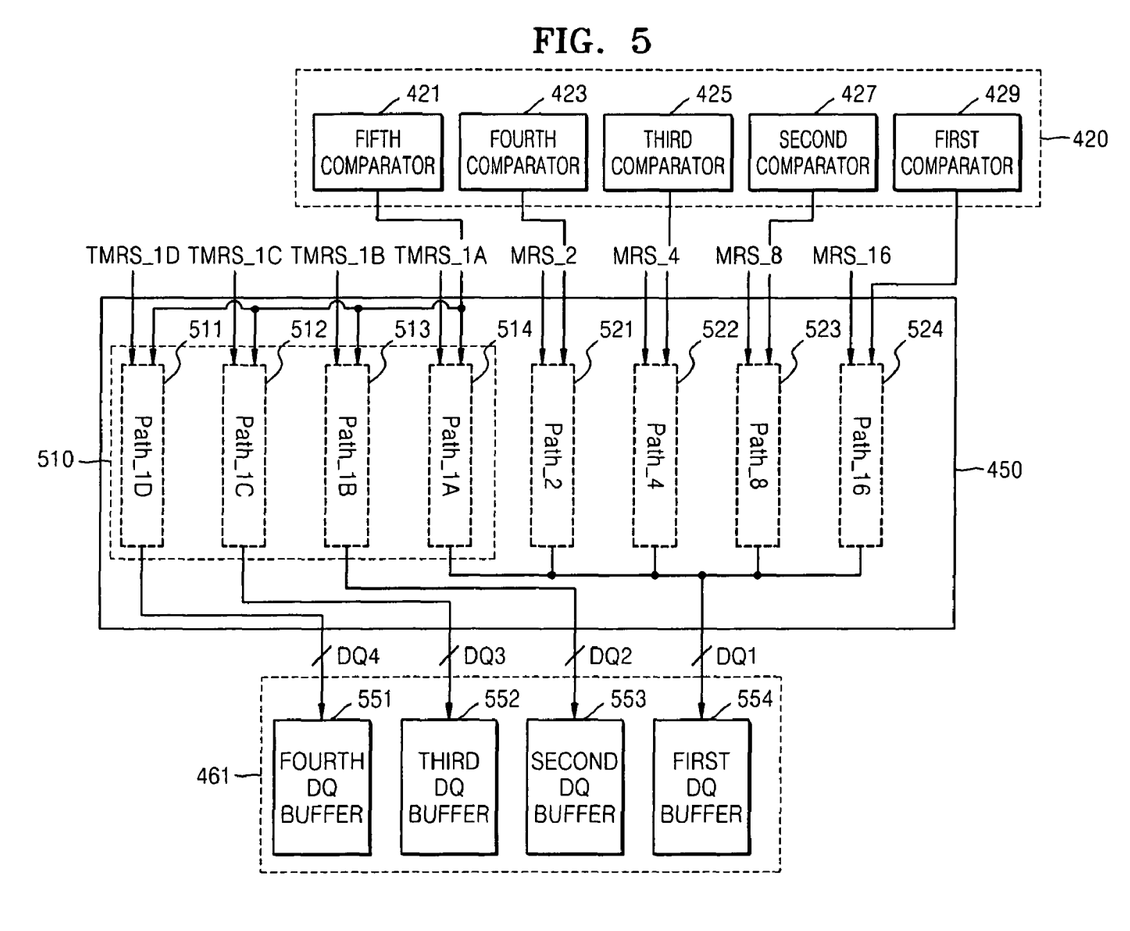
FIG. 5 is a diagram (according to an exemplary embodiment of the present invention) for describing structures and operations of a multiplexer (MUX) and coder illustrated in FIG. 4.

FIG. 5 is a diagram (according to an exemplary embodiment of the present invention) for describing structures and operations of the MUX and coder unit 450 illustrated in FIG. 4.

In FIG. 5, the comparing unit 420 of FIG. 4 includes five comparators. A representative data signal is outputted from a fifth comparator 421. The MUX and coder unit 450 determines a data signal line, in which the representative data signal is to be transmitted, in response to first test MRS signals TMRS_1A, B, C, and D set by a user, and outputs the representative data signal to a corresponding buffer.

Here, a DQ buffer unit 461 includes a plurality of buffers connected to data signal lines. For example, a first DQ buffer 554, a second DQ buffer 553, a third DQ buffer 552, and a fourth DQ buffer 551 may be respectively connected to data signal lines DQ1, DQ2, DQ3, and DQ4. Data signal lines connected to each buffer may be differently set by the user.

In a first memory chip, when the user only inputs TMRS_1A in an activate state, the representative data signal may be outputted through Path_1A 514. Accordingly, the representative data signal may be outputted to a data signal line connected to the first DQ buffer 554. In a second chip, when the user only inputs TMRS_1B in an activate state, the representative data signal may be outputted through Path_1B 513. Accordingly, the representative data signal may be outputted to a data signal line connected to the second DQ buffer 553.

That is, the user independently may set the first test MRS signals TMRS_1A, B, C, and D in order to simultaneously output the representative data signals, respectively, from a plurality of chips using different data signal lines.

As described above, a PBT apparatus according to one or more embodiments of the present invention may set test MRS signals TMRS based on a user's selection, and thus multiple ones of (if not the entirety of) the stacked chips can be simultaneously tested. Accordingly, test time can be reduced by 1/n compared to a conventional technology in which n×t1 was required to test n chips.

Here, when one representative data signal (e.g., 1 bit) is outputted and total data signal lines are, e.g., 16, then 16 chips can be simultaneously tested. Also, when two representative data signals (e.g., 2 bits) are outputted and total data signal lines are, e.g., 16, then 8 chips can be simultaneously tested.

A PBT method capable of reducing test time according to an embodiment of the present invention may have the same technical aspects as the PBT apparatus capable of reducing test time described above. Accordingly, detailed descriptions about the PBT method will be omitted, since one of ordinary skill in the art will be able to understand the PBT method referring to above.

As described above, the PBT apparatus can simultaneously test a plurality of chips by outputting representative data signals, as selected according to test MRS signals, using different data signal lines. Accordingly, test time may be reduced achieving quicker testing, and thus test costs can be reduced.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A parallel bit test (PBT) apparatus included in memory chips that are stacked in a multi-chip package (MCP) and share a set of data signal lines, the PBT apparatus comprising:
a comparing unit configured to output a representative data signal that is representative of a comparison between test data signals provided to a given one of the memory chips and corresponding data signals output therefrom, respectively; and
a coding unit configured to output the representative data signal using a first subset of the shared set of data signal lines, the first subset not overlapping other subsets used by coding units corresponding to the other ones of the memory chips, respectively, the coding unit selecting one or more of the data signal lines amongst the shared set of data signal lines for inclusion in the first subset according to a first test mode register set (MRS) signal wherein a plurality of the memory chips simultaneously output respective representative data using the respective non-overlapping subsets of the shared data signal lines.

2. The PBT apparatus as claimed in claim 1, wherein the first test MRS signal controls the representative data signals to be outputted via the first subset by changing a path through which a representative data signal, inputted to the coding unit, is outputted.

3. The PBT apparatus as claimed in claim 2, wherein the first test MRS signal is set and inputted by a user.

4. The PBT apparatus as claimed in claim 3, further comprising a buffer unit to buffer and then output the representative data signal outputted from the coding unit.

5. The PBT apparatus as claimed in claim 4, further comprising a driver to receive an input signal outputted from the buffer unit, and to drive and output the received signal onto a data signal line designated by the first test MRS signal.

6. The PBT apparatus as claimed in claim 3, wherein the comparing unit includes 1 through n comparators when 2n input data is inputted, and the number of representative data signals outputted is determined based on the number of comparators included.

7. The PBT apparatus as claimed in claim 6, wherein the comparing unit outputs 2n−1 representative data signals when k comparators are included, the comparators being connected in series and an output signal of the previous comparator being an input signal of the next comparator, wherein k and n are integers, and $1 \leq k \leq n$.

8. The PBT apparatus as claimed in claim 7, wherein each comparator compares and determines whether received data signals are the same using OR gates, and $2^{k-1}$ OR gates are included when $2^k$ data signals are inputted to the corresponding comparator.

9. The PBT apparatus as claimed in claim 8, wherein:
the comparing unit includes five comparators connected in series;
a first one of the comparators disposed first in the series receives a 32 bit data signal and a fifth one of the comparators disposed fifth in the series outputs a 1 bit representative data signal,
the first comparator includes 16 OR gates which logically OR the data signals, and outputs 16 signals to an input terminal of a second one of the comparators; and
the fifth comparator includes one OR gate which logically ORs an output signal received from a fourth one of the comparators connected thereto,
an output of the one OR gate being the 1 bit representative data signal.

10. The PBT apparatus as claimed in claim 8, wherein:
the comparing unit includes four comparators connected in series;
a first one of the comparators disposed first in the series receives a 32 bit data signal and a fourth one of the comparators disposed fourth in the series outputs a 2 bit representative data signal,
the first comparator includes 16 OR gates which logically OR the data signals, and outputs 16 signals to an input terminal of a second one of the comparators, and
the fourth comparator includes one OR gate which logically ORs an output signal received from a third one of the comparators connected thereto,
an output of the one OR gate being the 2 bit representative data signal.

11. The PBT apparatus as claimed in claim 1, wherein each PBT apparatus is activated when a second test MRS signal representing a command to perform a PBT is applied to the memory chips for simultaneously testing the memory chips, and the second test MRS signal is set and inputted by the user.

12. The PBT apparatus as claimed in claim 1, further comprising an input signal processor, positioned prior to the comparing unit and including at least one bit line sense amplifier, to output an inversion signal and a non-inversion signal, wherein the comparing unit receives the non-inversion signal outputted from the input signal processor.

13. A parallel bit test (PBT) method which simultaneously tests memory chips stacked in a multi-chip package (MCP), the memory chips sharing a set of data signal lines, the PBT method comprising:

receiving a command to perform a PBT on the memory chips;

outputting representative data signals that represent comparisons between groups of test data signals provided to the memory chips and corresponding groups of data signals output therefrom, respectively;

selecting non-overlapping subsets of the one or more of the data signal lines amongst the shared set of data signal lines, the non-overlapping subsets corresponding to the memory chips, respectively; and simultaneously outputting the representative data signals via the non-overlapping subsets of data signal lines, respectively.

14. The PBT method as claimed in claim 13, wherein the first test MRS signal controls the representative data signals to be outputted to the different data signal lines by changing a path through which the representative data signal, outputted from the memory chip, is outputted.

15. The PBT method as claimed in claim 14, wherein the first test MRS signal is set and inputted by a user.

16. The PBT method as claimed in claim 14, wherein the inputting of the command comprises:

inputting the command to all memory chips; and selecting all memory chips to be parallel bit tested by applying a memory chip selecting signal to all memory chips.

17. The PBT method as claimed in claim 14, wherein in the performing of the PBT and the outputting of the representative data signal, the input data signals are compared and sameness thereof is determined using OR gates.

18. A multi-chip package (MCP), comprising: memory chips that share a plurality of data signal lines; and a plurality of parallel bit test (PBT) apparatuses at least associated with the memory chips, respectively;

each of the PBT apparatuses including:

a comparing unit configured to output a representative data signal that is representative of a comparison between test data signals provided to an associated one of the memory chips and corresponding data signals output therefrom, respectively; and a coding unit configured to output the representative data signal using a first subset of the shared set of data signal lines, the first subset not overlapping other subsets used by coding units corresponding to the other ones of the memory chips, respectively, the coding unit selecting one or more of the data signal lines amongst the shared set of data signal lines for inclusion in the first subset according to a first test mode register set (MRS) signal, wherein a plurality of the memory chips simultaneously output respective representative data using the respective non-overlapping subsets of the shared data signal lines.

19. The MCP as claimed in claim 18, wherein there is a 1:1 ratio between the memory chips and the PBT apparatuses.

20. The MCP as claimed in claim 18, wherein the first test MRS signal controls the representative data signals to be outputted via the first subset of the shared set of data signal lines by changing a path through which a representative data signal, inputted to the coding unit, is outputted.

* * * * *